US 10,957,761 B2

(12) United States Patent
Yeh et al.

(10) Patent No.: US 10,957,761 B2
(45) Date of Patent: Mar. 23, 2021

(54) ELECTRICAL ISOLATION FOR NANOSHEET TRANSISTOR DEVICES (71) Applicant: International Business Machines Corporation, Armonk, NY (US)

(72) Inventors: Chun-chen Yeh, Danbury, CT (US); Alexander Reznicek, Troy, NY (US); Veeraraghavan S. Basker, Schenectady, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/365,642

(22) Filed: Mar. 26, 2019

(65) Prior Publication Data
US 2020/0312956 A1 Oct. 1, 2020

(51) Int. Cl.
| H01L 29/06 | (2006.01) |
| H01L 29/66 | (2006.01) |
| H01L 29/78 | (2006.01) |
| H01L 29/08 | (2006.01) |
| H01L 29/423 | (2006.01) |
| H01L 29/04 | (2006.01) |

(52) U.S. Cl.
CPC ........ H01L 29/0653 (2013.01); H01L 29/045 (2013.01); H01L 29/0847 (2013.01); H01L 29/42392 (2013.01); H01L 29/6681 (2013.01); H01L 29/66545 (2013.01); H01L 29/66553 (2013.01); H01L 29/7853 (2013.01)

(58) Field of Classification Search
CPC ............... H01L 29/0653; H01L 29/045; H01L 29/0847; H01L 29/41392; H01L 29/66545; H01L 29/66553; H01L 29/6681; H01L 29/7853
See application file for complete search history.

(56) References Cited

U.S. PATENT DOCUMENTS

| 9,246,003 | B2 | 1/2016 | Cheng et al. |
| 9,385,218 | B1 | 7/2016 | Cheng et al. |
| 9,583,620 | B2 | 2/2017 | Zhou et al. |
| 9,647,123 | B1 | 5/2017 | Balakrishnan et al. |
| 9,721,827 | B2 | 8/2017 | Lee et al. |
| 9,881,998 | B1 | 1/2018 | Cheng et al. |
| 10,103,238 | B1 * | 10/2018 | Zang ................... H01L 29/1079 |

(Continued)

OTHER PUBLICATIONS

Changliang Qin et al., "Study of sigma-shaped source/drain recesses for embedded-SiGe MOSFETs", Microelectronic Engineering, 2017, pp. 22-28, vol. 81.

Primary Examiner — Seahvosh Nikmanesh
(74) Attorney, Agent, or Firm — Erik Johnson; Otterstedt, Wallace & Kammer, LLP (57) ABSTRACT Self-limiting cavities are formed within a crystalline semiconductor substrate and beneath a stack of semiconductor layers used to form a nanosheet transistor device. Inner ends of the cavities merge beneath the stack while the outer ends thereof adjoin isolation regions within the substrate. The cavities are filled with electrically insulating material to provide bottom device isolation. Source/drain regions are grown in vertical trenches extending through the stack of semiconductor layers following formation of dielectric inner spacers. The bottom ends of the trenches adjoin the electrically insulating material within the cavities.

14 Claims, 6 Drawing Sheets (56) References Cited

U.S. PATENT DOCUMENTS

| | | |
|---|---|---|
| 2012/0064686 A1 | 3/2012 | Farber et al. |
| 2014/0322879 A1 | 10/2014 | Li et al. |
| 2016/0240672 A1 | 8/2016 | Li et al. |
| 2018/0233557 A1 | 8/2018 | Cheng et al. |
| 2018/0277656 A1* | 9/2018 | Chao ................. H01L 21/02247 |
| 2019/0296127 A1* | 9/2019 | Cheng .................... B82Y 10/00 |

* cited by examiner

ELECTRICAL ISOLATION FOR NANOSHEET TRANSISTOR DEVICES

BACKGROUND

The present invention relates generally to the electrical, electronic and computer arts and, more particularly, to methods for electrically isolating elements of nanosheet transistor devices and structures obtained thereby.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors.

BRIEF SUMMARY

A method of fabricating a fabricating a nanosheet transistor structure includes obtaining a monolithic structure including a semiconductor substrate and a vertical stack of nanosheet channel layers and sacrificial semiconductor layers on the semiconductor substrate, the nanosheet channel layers and the sacrificial semiconductor layers being arranged in alternating sequence. First and second vertical trenches are formed through the vertical stack down to the semiconductor substrate. First and second cavities are formed within the semiconductor substrate extending, respectively, from the first and second vertical trenches. The first and second cavities merge beneath a portion of the vertical stack. The method further includes filling the first and second cavities with an electrically insulating material and epitaxially growing first and second source/drain regions on the nanosheet channel layers. The first source/drain region is grown within the first vertical trench and directly over the first cavity while the second source/drain region is grown within the second vertical trench and directly over the second cavity.

In a further aspect, a method of fabricating a nanosheet transistor structure includes obtaining a monolithic structure including a semiconductor substrate comprising silicon and a vertical stack of nanosheet channel layers and sacrificial semiconductor layers on the semiconductor substrate. The nanosheet channel layers and the sacrificial semiconductor layers are arranged in alternating sequence and a sacrificial gate layer extends over the vertical stack. First and second trenches are formed within the sacrificial gate layer and extend vertically downwardly towards the vertical stack. The first and second trenches are extended through the vertical stack down to the semiconductor substrate. The method further includes conducting a directional first etch to form first and second recesses within the semiconductor substrate, the first recess extending vertically from the first trench and the second recess extending vertically from the second trench. A self-limiting second etch following the directional first etch forms first and second cavities beneath, respectively, the first and second recesses, the first and second cavities merging beneath a portion of the vertical stack. The first and second recesses and the first and second cavities are filled with an electrically insulating material. The end portions of the sacrificial semiconductor layers adjoining the first and second vertical trenches are removed to form indented regions between the nanosheet channel layers. Dielectric inner spacers are formed within the indented regions. First and second source/drain regions are epitaxially grown on the nanosheet channel layers. The first source/drain region is grown within the first trench and directly over the first cavity while the second source/drain region is grown within the second trench and directly over the second cavity.

In a further aspect of the invention, a monolithic nanosheet transistor structure includes a semiconductor substrate including first and second shallow trench isolation regions. A gate-all-around structure of the monolithic nanosheet transistor structure includes a plurality of parallel semiconductor channel layers on the semiconductor substrate and a plurality of gate stacks positioned between and in alternating sequence with the channel layers, each of the gate stacks including gate dielectric and gate electrode materials. First and second vertical trenches extend through the gate-all-around structure. First and second epitaxial source/drain regions are located, respectively, within the first and second vertical trenches of the gate-all-around structure and are operatively associated with the channel layers. First and second cavities within the semiconductor substrate are aligned, respectively, with the first and second vertical trenches. The first and second cavities include inner end portions that merge with each other beneath the gate-all-around structure. An electrically insulating layer fills the first and second cavities.

Techniques and structures as disclosed herein can provide substantial beneficial technical effects. By way of example only and without limitation, one or more embodiments may provide one or more of the following advantages:

Bottom device isolation;

Avoidance of source/drain epitaxial connection to substrate.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

An exemplary sequence of steps that may be employed for fabricating nanosheet field-effect transistor devices is shown in the figures. The monolithic structure 20 shown in FIG. 1 includes a stack of alternating channel layers 21 and silicon germanium layers 22 formed on a semiconductor substrate 24. The semiconductor channel layers 21 may be, for example, silicon nanosheets. The nanosheets can be formed on a semiconductor-on-insulator substrate or on a bulk semiconductor substrate such as a bulk silicon substrate. Shallow trench isolation (STI) regions 26 formed within the substrate 24 provide electrical isolation of neighboring transistors or other devices that may be formed on the substrate.

Figure 1:
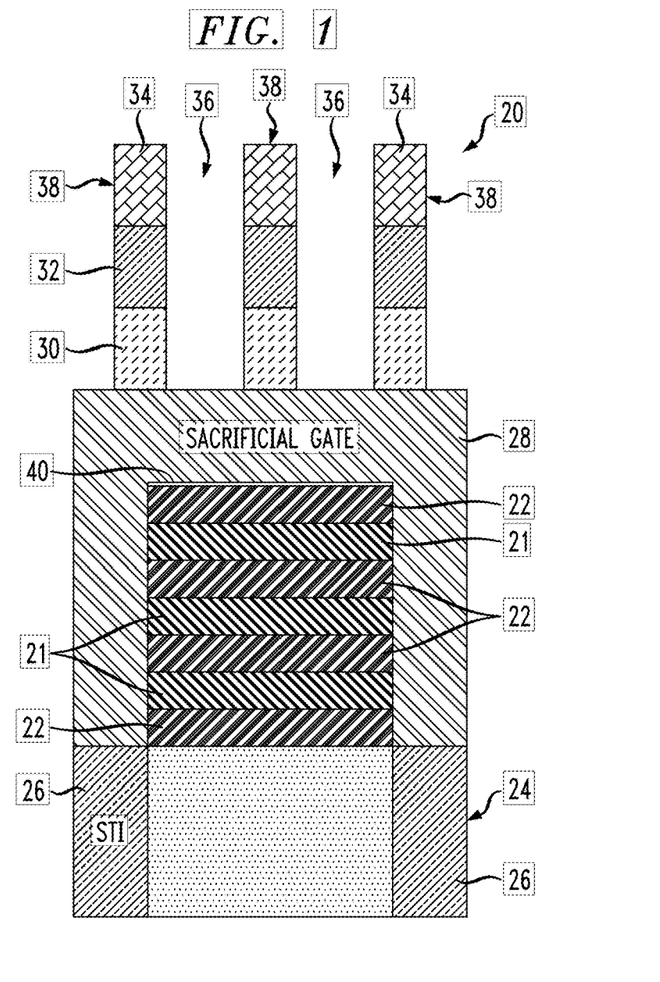
FIG. 1 is a schematic, cross-sectional view showing a nanosheet stack having a sacrificial gate layer thereon and a patterned hard mask over the sacrificial gate layer.

In one or more exemplary embodiments, the semiconductor channel layers 21 each have a thickness in the range of four to ten nanometers (4-10 nm). The number of semiconductor (channel) layers in the semiconductor layer stack may vary depending on the desired uses and capabilities of the nanosheet transistors to be fabricated. The channel layers 21 may consist essentially of monocrystalline silicon layers, possibly including impurities, and are spaced six to twenty nanometers (6-20 nm) apart in some embodiments. The width of each semiconductor channel layer 21 is fifty nanometers (50 nm) in some embodiments.

The silicon germanium layers 22, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 22 may have the composition $Si_{1-x}Ge_{1-x}$ where x is between 0.2 and 0.8 to allow selective etching with respect to silicon.

Silicon and silicon germanium layers can be epitaxially grown in alternating sequence to obtain a vertical stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

A sacrificial gate layer 28 extends over the stack of nanosheet layers 21, 22 and the STI regions 26. The sacrificial gate layer 28 may comprise, for example, amorphous silicon (a-Si) or polycrystalline silicon (polysilicon). Sacrificial gate material used to form the sacrificial gate 28 may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial gate layer adjoins an oxide layer 40 on the top surface of the stack of nanosheet layers. A layer of silicon dioxide may be deposited conformally on the nanosheet stacks to form the oxide layer on the top surfaces and sidewalls thereof A hard mask is formed on the sacrificial gate layer 28 and patterned. First and second layers 30, 32 of dielectric material are deposited on the sacrificial gate. The first (bottom) dielectric layer may, for example, be a layer of silicon oxynitride, silicon nitride, SiBCN (siliconborocarbonitride), or SiOCN (siliconoxycarbonitride). The second (top) dielectric layer may, for example, be an oxide layer such as silicon dioxide, tetraethylorthosilicate (TEOS) oxide, high aspect ratio plasma (HARP) oxide, high temperature oxide (HTO), or high density plasma (HDP) oxide. A silicon nitride ($Si_3N_4$) layer can be deposited via CVD, PECVD, sputtering, or other suitable technique. Oxide layers such as silicon oxides can be formed using atomic layer deposition (ALD). A patterned photoresist layer 34 is formed over the hard mask. A hard mask etch process is employed to form trenches 36 between portions of the dielectric layers 30, 32 of the hard mask. As schematically illustrated in FIG. 1, vertical columns 38 including remaining portions of the dielectric layers 30, 32 extend from the top surface of the sacrificial gate layer 28. The sidewalls of the trenches 36, from the view taken in FIG. 1, may be about thirty to forty nanometers (30-40 nm) apart.

Figure 2:
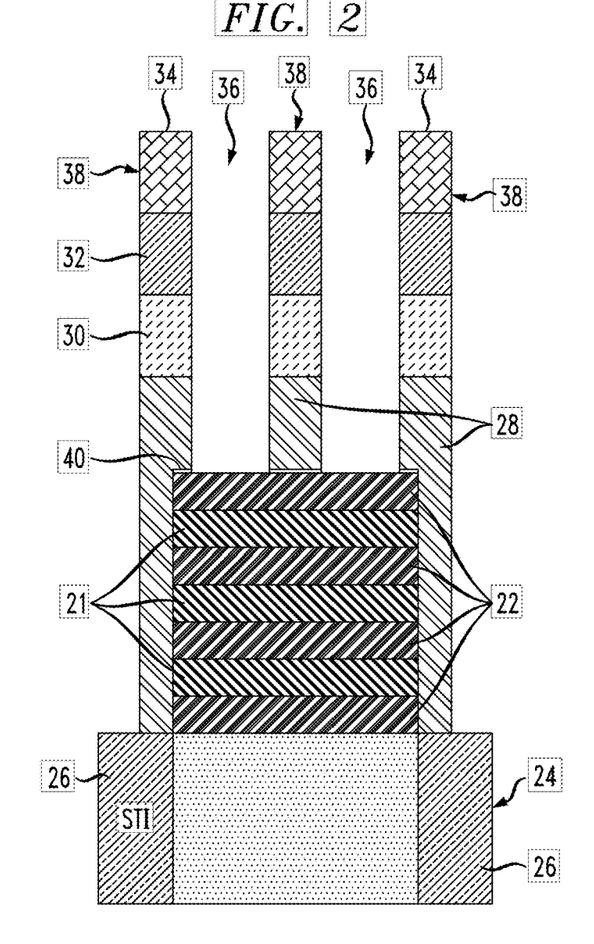
FIG. 2 is a schematic, cross-sectional view thereof following patterning of the sacrificial gate layer and removal of an oxide layer.

A reactive ion etch (RIE) is employed to remove material from the sacrificial gate layer 28. The portions of the sacrificial gate protected by the hard mask remain essentially intact. As shown in FIG. 2, the trenches 36 are extended through the sacrificial gate layer 28 down to the top surface of the oxide layer 40 on the stack of nanosheet layers 21, 22 following patterning of the sacrificial gate layer 28. The extended portions of the trenches 36 include substantially vertical sidewalls. The exposed portions of the oxide layer 40 at the trench bottoms are selectively removed using, for example, a dry etch and a wet clean that will have little effect on the oxide portions 32 of the columns 38. Oxide removal is conducted using, for example, a SiCoNi™ vapor phase etch process. A SiCoNi™ etch is a plasma-assisted dry etch process that involves simultaneous exposure of a substrate to hydrogen, $NF_3$ and $NH_3$ plasma by-products. A layer of oxide remains beneath the portions of the sacrificial gate that adjoin the stack of nanosheet layers, as shown in FIG. 2. A top surface of the silicon germanium layer 22 at the top of the stack of nanosheets is exposed following oxide removal.

Figure 3:
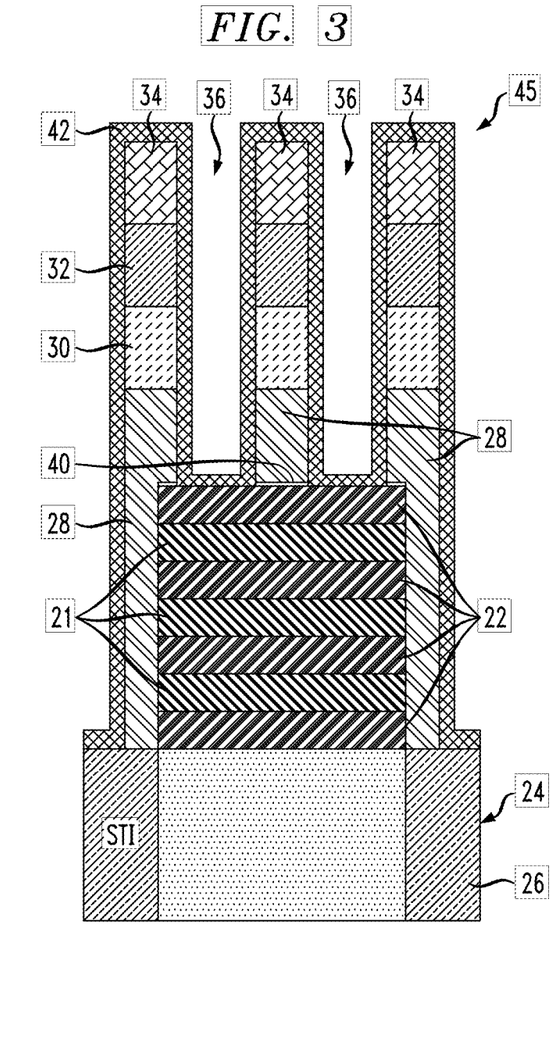
FIG. 3 is a schematic, cross-sectional view thereof following a conformal spacer deposition.

A top spacer 42 of dielectric material is conformally deposited on the structure and over the top surfaces and sidewalls of the columns 38. The top spacer may have a thickness between five and seven nanometers (5-7 nm). The top spacer layer may contain any suitable dielectric material(s) including but not limited to silicon-based, low-k dielectrics (e.g., k less than about 4.0). Plasma-enhanced CVD is a technique often used for the deposition of low-k dielectric materials such as porous siliconoxycarbonitride (SiOCN). An SiCOH dielectric film having a dielectric constant (k) of about 2.7-2.8 can be alternatively employed in forming the top spacer layer. Such a dielectric film can be deposited using PECVD. Various methods such as PECVD, atomic layer deposition (ALD) and molecular layer deposition (MLD) may be employed for deposition top spacer material. A structure 45 as schematically illustrated in FIG. 3 may be obtained.

Figure 4:
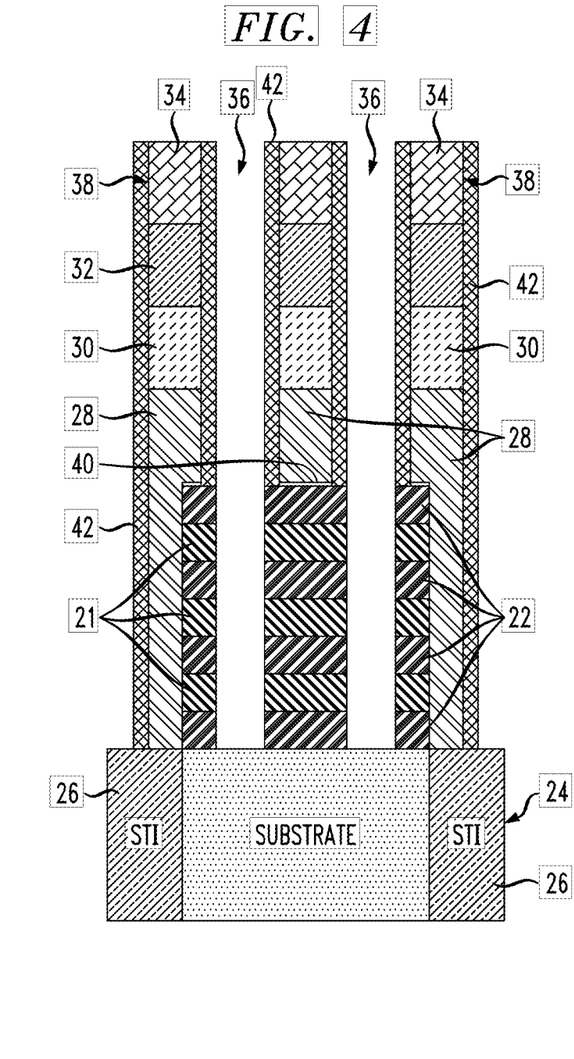
FIG. 4 is a schematic, cross-sectional view thereof following formation of trenches within the nanosheet stack.

A reactive ion etch is employed to remove portions of the top spacer layer 42 from the top surfaces of the columns and from the top surfaces of the stack of nanosheets to form spacers. The portions of the top spacer 42 lining the sidewalls of the vertical columns 38 remain essentially intact. Sidewalls of the photoresist layer, the oxide layer, the nitride layer and the sacrificial gate are accordingly lined by the remaining spacer material. A further reactive ion etch (RIE) down to the top surface of the substrate 24 may be employed to remove portions of the semiconductor layers 21, 22, thereby further extending the trenches 36. As shown in FIG. 4, the top surface of the semiconductor substrate 24 is exposed.

Figure 5:
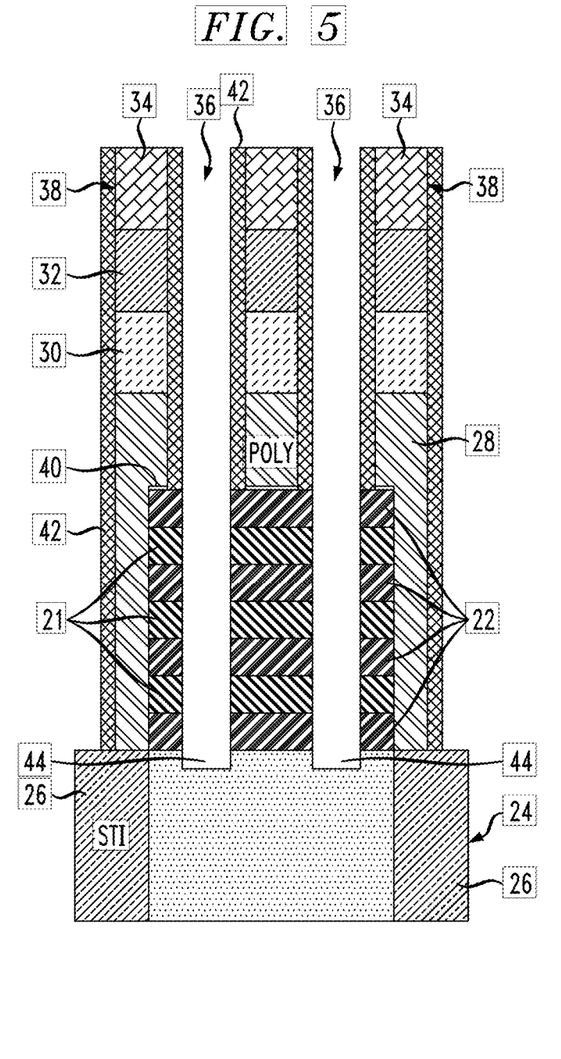
FIG. 5 is a schematic, cross-sectional view thereof following formation of recesses in the substrate.

A directional etch (for example, RIE) is employed to form recesses 44 within the substrate. The recesses are aligned with the trenches 36 and extend about fifteen to twenty nanometers (15-20 nm) into the semiconductor (e.g. silicon) portion of the substrate 24. The sidewalls of the recesses 44 are substantially vertical. The directional etch of the substrate is followed by a self-limiting anisotropic wet etching process stopping at <111> planes of the silicon substrate.

Figure 6:
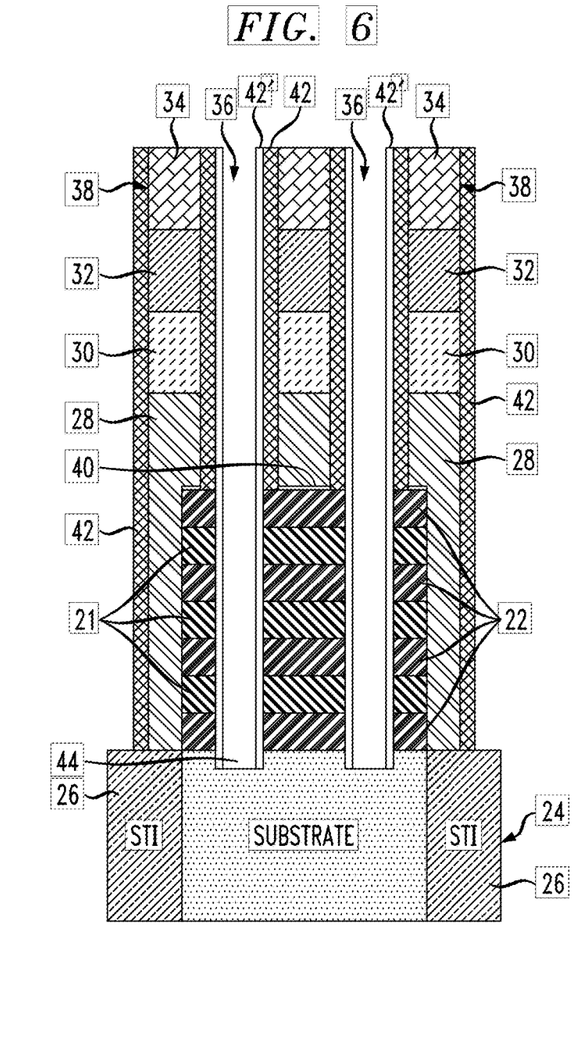
FIG. 6 is a schematic, cross-sectional view thereof following deposition of a protective liner within the trenches.

The channel layers 21 are protected during the self-limiting etch of the substrate 24 to avoid recessing the channel layers while a wet etch is employed to form cavities beneath the stack of nanosheet layers 21, 22. A conformal protective liner 42' is formed on the sidewalls of the trenches 36 following the directional etch used to form the recesses 44 within the substrate. A dielectric liner having a thickness of two to five nanometers (2-5 nm) may, for example, be formed. A dry etch is then employed to remove the portions of the protective liner at the bottoms of the recesses 44 to expose semiconductor surface portions of the substrate 24, as shown in FIG. 6. The protective liner 42' is selectively removed prior to recessing the silicon germanium layers 22 as described below.

In an exemplary embodiment, the active regions of the substrate 24 comprise monocrystalline silicon, though impurities may be present within the crystalline structure. Single crystal silicon wafers are commercially available and are characterized by a diamond cube lattice structure. As known in the art, the Miller indices of a substrate are determined from the reciprocals of the points at which the crystal plane of silicon intersects the principal crystalline axes. Exemplary embodiments as described herein relate to structures including doped or undoped (100) silicon as a substrate material. Etching of silicon using strong alkaline etches is highly anisotropic. While <100> and <110> crystal planes are being etched, the stable <111> planes function as etch stops. The etch process is accordingly self-limiting.

Figure 7:
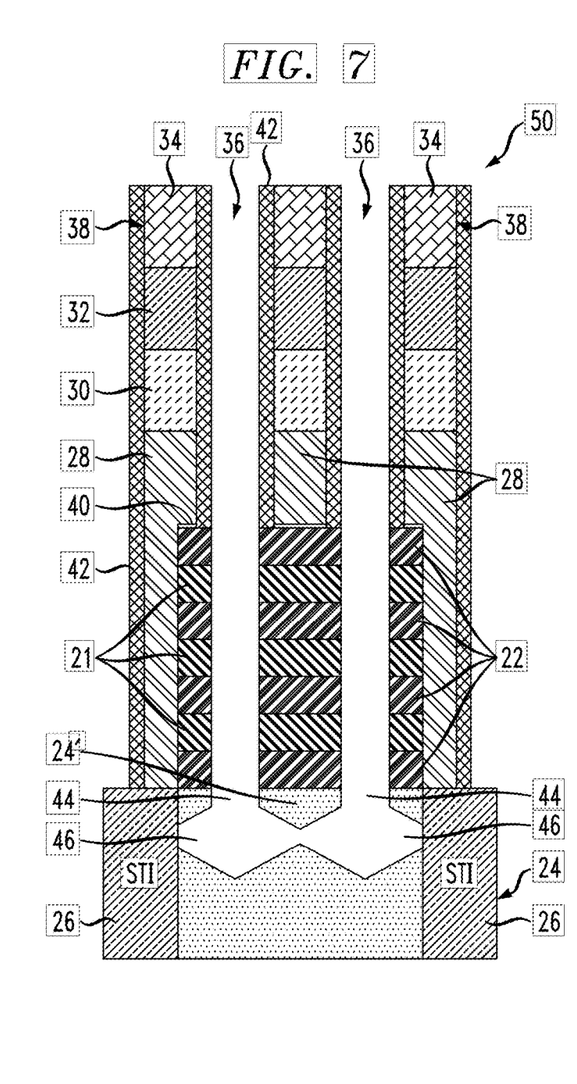
FIG. 7 is a schematic, cross-sectional view thereof following anisotropic etching of the substrate to form a recess beneath the nanosheet stack.

An exemplary process for obtaining a structure 50 as shown in FIG. 7 employs TMAH (tetramethyl ammonium hydroxide) or ammonia ($NH_4OH$) in the self-limiting etch of the substrate. Diamond-shaped cavities 46 are formed beneath each recess 44, each of the cavities being bounded by <111> planes of the crystalline substrate 24. The trenches 36 and underlying recesses 44 are spaced closely enough that the diamond-shaped cavities 46 merge at their inner ends to form a single, generally sigma-shaped cavity beneath the stack of semiconductor layers 21, 22 between the two trenches 36. The STI regions are also sufficiently close to the recesses 44 that the diamond-shaped cavities intersect them at their outer ends. A residual portion 24' of the substrate 24 remains above the joined cavities 46 and beneath the stack of nanosheets.

Figure 8:
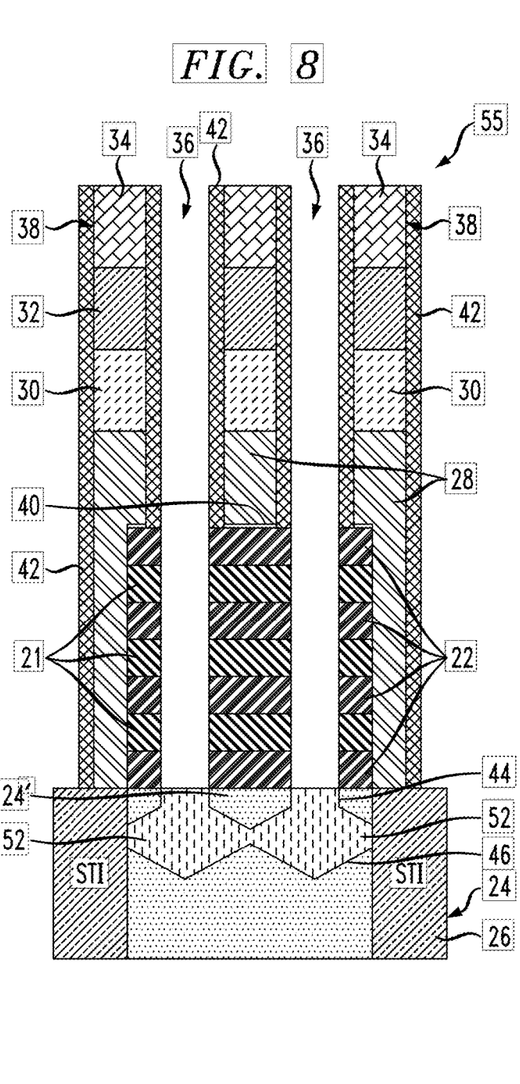
FIG. 8 is a schematic, cross-sectional view thereof following filling of the recess with an electrically insulating material.

A dielectric material is deposited, filling the trenches 36, the recesses 44 and the joined cavities 46. The deposited dielectric material is etched back to provide a structure 55 as schematically illustrated in FIG. 8. The protective liner 42' may be removed prior to depositing the dielectric material within the recesses and cavities. Following etch-back, the dielectric fill 52 within the recesses 44 and cavities 46 continues to completely cover the bottom and sidewall portions of the residual substrate portion 24'. The dielectric material filling the recesses and trenches may or may not be the same as the dielectric material used to form the STI regions. Silicon dioxide is deposited in some embodiments. In one or more exemplary embodiments, a high density plasma chemical vapor deposited (HDP-CVD) oxide comprises the dielectric fill 52. Such HDP-CVD oxides are formed using downstream plasmas containing $SiH_4/Ar/O_2$ gases. The dielectric fill 52 forms a continuous layer beneath the nanosheet stack (21, 22) and between STI regions 26 of the monolithic structure 55. The dielectric fill 52 extends up to at least the top surface of the semiconductor substrate 24.

Figure 9:
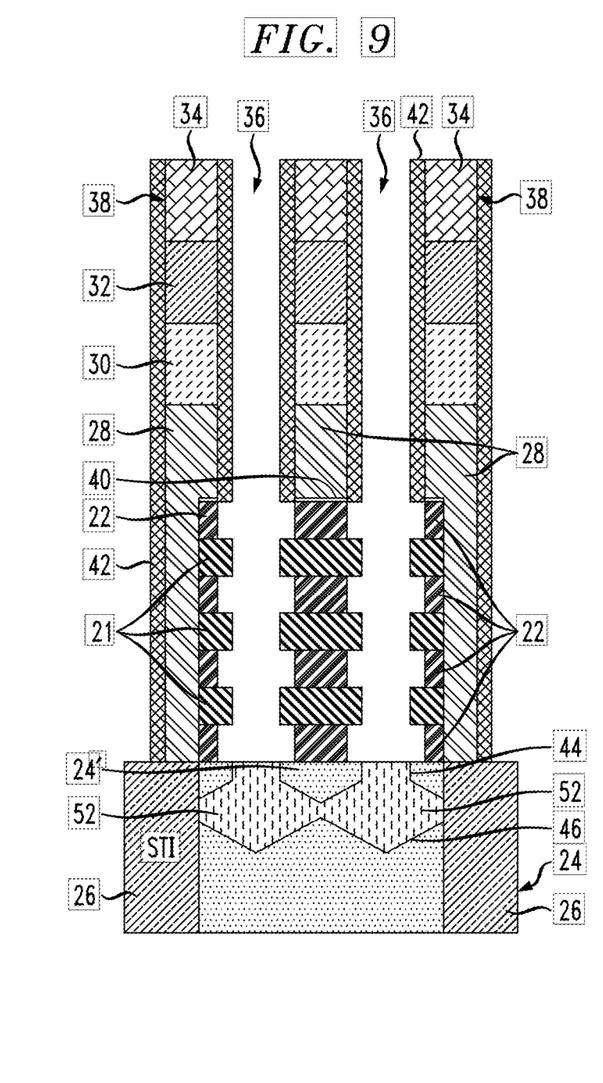
FIG. 9 is a schematic, cross-sectional view thereof following partial etching of the silicon germanium layers in the nanosheet stack.

Referring to FIG. 9, the monolithic structure 55 shown in FIG. 8 is subjected to a timed wet etching process to selectively recess the silicon germanium layers 22 of the stack of nanosheets. Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. Each exposed end of the silicon germanium layers 22 may be recessed by, for example, three to five nanometers (3-5 nm). The silicon germanium layers 22 have smaller widths than the widths of the silicon (channel) layers 21 following the timed etch. The stack of nanosheets accordingly includes indents between the end portions of each pair of silicon layers.

Figure 10:
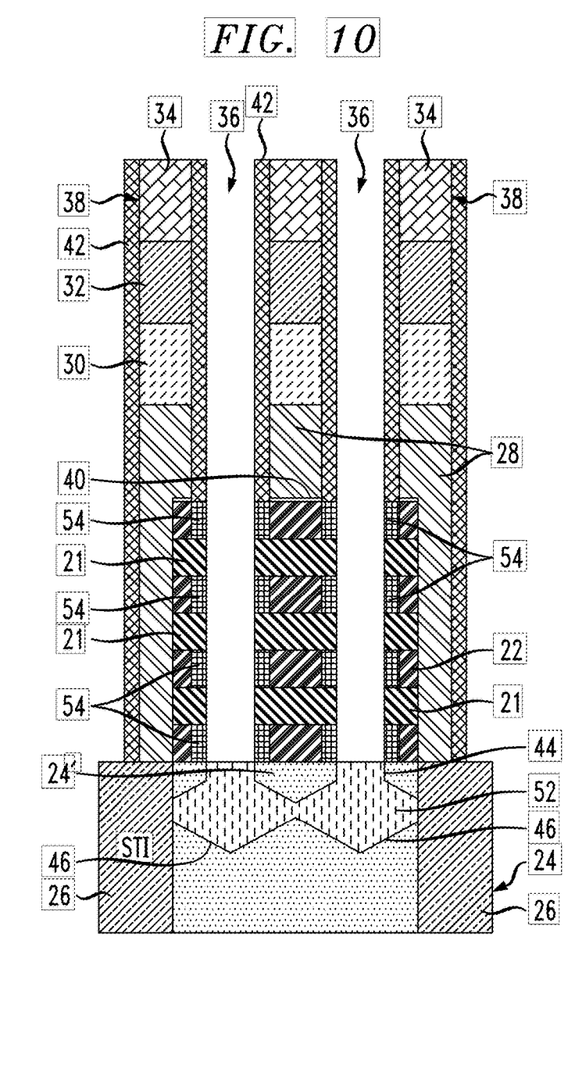
FIG. 10 is a schematic, cross-sectional view thereof following inner spacer formation.

Dielectric spacer material is deposited in the trenches 36 and etched back to form inner spacers 54 within each of the indents in the stack of nanosheets. A reactive ion etch may be employed to remove the dielectric inner spacer material down to the dielectric fill 52 at the bottom ends of the trenches. A structure as schematically illustrated in FIG. 10 may be obtained. The inner spacers 54 of the structure may consist essentially of, for example, low-k dielectric material. Silicon oxynitride, SiBCN (silicon borocarbonitride), SiOCN (silicon oxycarbonitride), and/or SiOC (silicon oxycarbide) inner spacers may be formed in some embodiments. The etching of the inner spacer material is selective with respect to the dielectric fill (for example, HDP oxide) 52 in the recesses 44 and cavities 46 within the substrate 24. Relatively low-k silicon nitride-based materials used to form the inner spacers 54 can be selectively etched using, for example, phosphoric acid.

Figure 11:
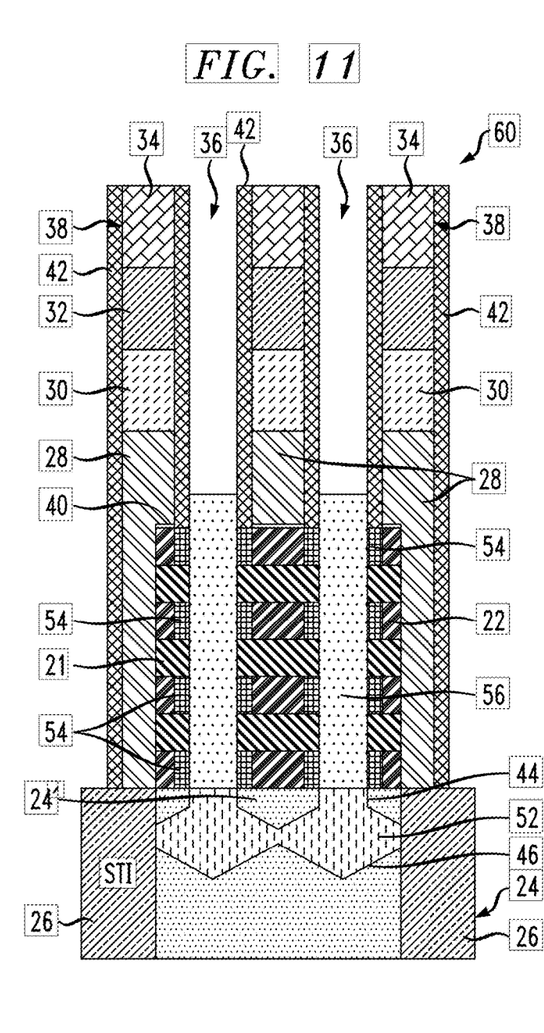
FIG. 11 is a schematic, cross-sectional view thereof following growth of doped source/drain regions.

Source/drain regions 56 are epitaxially grown within the trenches 36 on the exposed edges of the silicon (channel) layers 21. The source/drain regions are electrically isolated from the substrate 24, 24' by the dielectric fill 52 within the cavities 46 and recesses 44. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. FIG. 11 schematically illustrates an exemplary monolithic structure 60 following epitaxial growth of source/drain regions 56 on the exposed edge portions of the channel layers 21 and over the dielectric fill 52. The process described herein avoids the bottom-up growth of source/drain epitaxy from the substrate and without epitaxial connection to the substrate 24.

Figure 12:
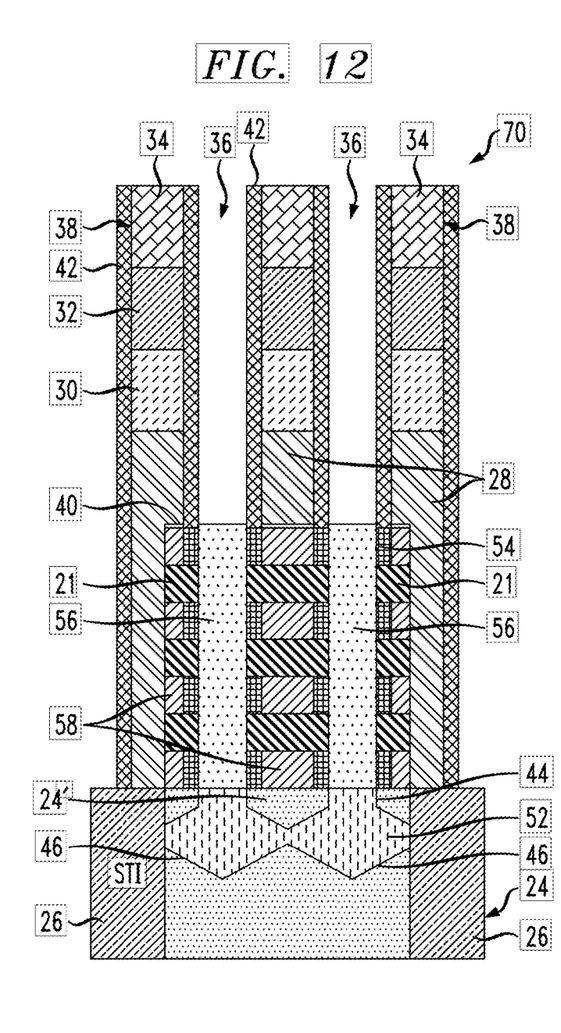
FIG. 12 is a schematic, cross-sectional view thereof following removal of the silicon germanium layers from the nanosheet stack and a replacement metal gate process.

The silicon germanium layers 22 are selectively removed to obtain a stack of silicon (channel) layers 21 separated by spaces (not shown). Hydrogen chloride gas is employed in some embodiments to selectively remove silicon germanium, leaving the silicon nanosheets substantially intact. Alternatively, a wet etch process containing ammonia and hydroperoxide can be used to etch SiGe selective to other materials within the monolithic structure. As shown in FIG. 12, spaces formed between the silicon (channel) nanosheet layers 21 are filled with gate dielectric and gate metal materials that form gate stacks 58 of the nanosheet transistor structure 70.

A gate dielectric layer forms portions of the gate stacks that replace the sacrificial silicon germanium layers. The gate stacks adjoin the silicon nanosheet channel layers 21. Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer incudes multiple layers.

Electrically conductive gate material is deposited in the spaces formerly filled by the silicon germanium layers. The deposited metal gate material forms the metal gate of the nanosheet field-effect transistors. In some embodiments, the electrically conductive gate includes a work function metal (WFM) layer. In some embodiments, the WFM serves dual purposes: Vt setting and gate conductor. Non-limiting examples of suitable work function metals include p- type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. In one exemplary embodiment, a titanium nitride layer having a thickness of three nanometers (3 nm) is formed on the gate dielectric layer. Threshold voltage can be modulated through WFM thickness as well as the inter-nanosheet (channel) spacing.

The exemplary nanosheet transistor structure 70 shown in FIG. 12 includes a substrate 24, a pair of shallow trench isolation regions 26 extending within the substrate, and a plurality of parallel semiconductor channel layers 21 on the substrate 24. The channel layers are vertically aligned with a semiconductor region of the substrate 24 and do not overlap the shallow trench isolation regions 26. Gate stacks 58 including gate dielectric and gate electrode materials are between and in alternating sequence with the channel layers 21, forming a vertically stacked, gate-all-around (GAA) structure. First and second vertical trenches extend through the GAA structure. First and second epitaxial source/drain regions 56 are located, respectively, within the first and second vertical trenches of the GAA structure. The source/drain regions 56 are operatively associated with the channel layers 21. Recesses 44 extend into the substrate 24 from the bottom of each trench. Diamond-shaped cavities 46 extend into the semiconductor region of the substrate from the recesses. The cavities 46 have inner end portions that merge with each other and outer end portions that adjoin the shallow trench isolation regions 26. The walls of the cavities are comprised of <111> crystal planes. A portion 24' of the substrate 24 is located between the merged region of the cavities and the GAA structure. Electrically insulating material fills the cavities 46 and the recesses 44 and provides bottom isolation.

The exemplary nanosheet transistor structure 70 includes elements that are removed and/or replaced in subsequent processing. The sacrificial gate layer is, for example, replaced with electrically conductive material. Source/drain contacts (not shown) are formed any suitable patterning and metallization processes.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary method of fabricating a nanosheet transistor structure includes obtaining a monolithic structure including a semiconductor substrate 24 and a vertical stack of nanosheet channel layers 21 and sacrificial semiconductor layers 22 on the semiconductor substrate. The nanosheet channel layers 21 and the sacrificial semiconductor layers 22 are arranged in alternating sequence, and a sacrificial gate layer 28 extends over the vertical stack. FIG. 1 shows an exemplary monolithic structure 20. First and second trenches 36 are formed within the sacrificial gate layer 28 as schematically illustrated in FIG. 2. The trenches 36 are vertically extended through the vertical stack down to the semiconductor substrate, as shown in FIG. 4. A directional first etch is employed to form first and second recesses 44 within the semiconductor substrate 24, the first recess extending vertically from the first vertical trench and the second recess extending vertically from the second vertical trench as illustrated in FIG. 5. A self-limiting second etch subsequent to the directional first etch is used to form first and second cavities 46 beneath, respectively, the first and second recesses. As schematically illustrated in FIG. 7, the first and second cavities 46 merge beneath a portion of the vertical stack. The recesses 44 and the merged cavities are then filled with an electrically insulating material to obtain a structure as exemplified by that shown in FIG. 8. End portions of the sacrificial semiconductor layers 22 are removed to form indented regions between the nanosheet channel layers, such as shown in FIG. 9. Dielectric inner spacers 54 are formed within the indented regions as shown in FIG. 10. First and second source/drain regions are grown on the exposed end portions of the nanosheet channel layers and within the vertical trenches. Being grown over an isolation region comprising the electrically insulating material within the recesses and cavities, the source/drain regions will not be electrically connected to the substrate 24. FIG. 11 schematically illustrates an exemplary structure following epitaxial growth of source/drain regions 56.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nanosheet FET devices formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a nanosheet transistor structure, comprising:

obtaining a monolithic structure including a semiconductor substrate and a vertical stack of nanosheet channel layers comprising silicon and sacrificial semiconductor layers comprising silicon germanium on the semiconductor substrate, the nanosheet channel layers and the sacrificial semiconductor layers being arranged in alternating sequence;

forming first and second vertical trenches through the vertical stack down to the semiconductor substrate;

conducting a directional first etch, thereby forming first and second recesses within the semiconductor substrate, the first recess extending vertically from the first vertical trench and the second recess extending vertically from the second vertical trench;

conducting a self-limiting second etch following the directional first etch, thereby forming first and second cavities within the semiconductor substrate extending, respectively, from the first and second vertical trenches and beneath, respectively, the first and second recesses, the first and second cavities merging beneath a portion of the vertical stack;

filling the first and second recesses and the first and second cavities with an electrically insulating material;

removing end portions of the sacrificial semiconductor layers adjoining the first and second vertical trenches, thereby forming indented regions between the nanosheet channel layers;

forming dielectric inner spacers within the indented regions;

epitaxially growing first and second source/drain regions on the nanosheet channel layers, the first source/drain region being grown within the first vertical trench and directly over the first cavity, the second source/drain region being grown within the second vertical trench and directly over the second cavity;

replacing the sacrificial semiconductor layers with a gate dielectric layer and gate metal.

2. The method of claim 1, wherein the self-limiting second etch terminates at <111> crystal planes of the semiconductor substrate.

3. The method of claim 1, further including first and second shallow trench isolation regions extending within the semiconductor substrate, and further wherein the first cavity contacts the first shallow trench isolation region and the second cavity contacts the second shallow trench isolation region.

4. The method of claim 1, further including:

forming a sacrificial gate layer over the vertical stack and the semiconductor substrate;

patterning the sacrificial gate layer, thereby forming first and second trench openings within the sacrificial gate layer and over the vertical stack; and wherein the first and second vertical trenches through the vertical stack are respectively formed in vertical alignment with the first and second trench openings within the sacrificial gate layer.

5. The method of claim 4, further including forming a sidewall spacer layer on the sacrificial gate layer and extending within the first and second trench openings.

6. The method of claim 1, further including:

forming a sidewall liner within the first and second vertical trenches prior to forming the first and second cavities; and removing the sidewall liner prior to epitaxially growing the first and second source/drain regions.

7. The method of claim 1, wherein filling the first and second recesses and the first and second cavities with an electrically insulating material includes introducing a high density plasma chemical vapor deposited oxide within the first and second recesses and the first and second cavities.

8. A method of fabricating a nanosheet transistor structure comprising:
   obtaining a monolithic structure including a semiconductor substrate comprising silicon, a vertical stack of nanosheet channel layers and sacrificial semiconductor layers on the semiconductor substrate, the nanosheet channel layers and the sacrificial semiconductor layers being arranged in alternating sequence, and a sacrificial gate layer extending over the vertical stack;
   forming first and second trenches within the sacrificial gate layer, the first and second trenches extending vertically downwardly towards the vertical stack;
   extending the first and second trenches through the vertical stack down to the semiconductor substrate;
   conducting a directional first etch to form first and second recesses within the semiconductor substrate, the first recess extending vertically from the first trench and the second recess extending vertically from the second trench;
   conducting a self-limiting second etch following the directional first etch to form first and second cavities beneath, respectively, the first and second recesses, the first and second cavities merging beneath a portion of the vertical stack;
   filling the first and second recesses and the first and second cavities with an electrically insulating material;
   removing end portions of the sacrificial semiconductor layers adjoining the first and second trenches to form indented regions between the nanosheet channel layers;
   forming dielectric inner spacers within the indented regions; and
   epitaxially growing first and second source/drain regions on the nanosheet channel layers, the first source/drain region being grown within the first trench and directly over the first cavity, the second source/drain region being grown within the second trench and directly over the second cavity.

9. The method of claim 8, wherein the nanosheet channel layers comprise silicon and the sacrificial semiconductor layers comprise silicon germanium.

10. The method of claim 9, further including:
   replacing the sacrificial semiconductor layers with a gate dielectric layer and gate metal.

11. The method of claim 8, further including first and second shallow trench isolation regions extending within the semiconductor substrate, and further wherein the first cavity contacts the first shallow trench isolation region and the second cavity contacts the second shallow trench isolation region.

12. The method of claim 11, wherein the sacrificial semiconductor layers comprise silicon germanium.

13. The method of claim 8, wherein filling the first and second recesses and the first and second cavities with an electrically insulating material includes introducing a high density plasma chemical vapor deposited oxide within the first and second recesses and the first and second cavities.

14. The method of claim 8, wherein the self-limiting second etch terminates at <111> crystal planes of the semiconductor substrate.

* * * * *